(12) United States Patent
Barlocchi et al.

(10) Patent No.: US 6,670,257 B1
(45) Date of Patent: Dec. 30, 2003

(54) METHOD FOR FORMING HORIZONTAL BURIED CHANNELS OR CAVITIES IN WAFERS OF MONOCRYSTALLINE SEMICONDUCTOR MATERIAL

(75) Inventors: Gabriele Barlocchi, Cornaredo (IT); Flavio Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/545,260

(22) Filed: Apr. 7, 2000

(30) Foreign Application Priority Data

Apr. 9, 1999 (EP) .............................. 99830206

(51) Int. Cl.[7] .............................................. H01L 21/76
(52) U.S. Cl. ........................ 438/422; 438/700; 438/456
(58) Field of Search .................. 438/52, 107, 627–667, 438/700, 960, 456, 421, 422, 411; 216/2–87; 73/514; 257/418, 419, 434, 619

(56) References Cited

U.S. PATENT DOCUMENTS

| 4,579,621 | A | | 4/1986 | Hine | |
| 4,993,143 | A | * | 2/1991 | Sidner et al. | 29/621.1 |
| 5,659,138 | A | * | 8/1997 | Iwata et al. | |
| 5,883,420 | A | * | 3/1999 | Mirza et al. | 257/419 |
| 5,889,872 | A | * | 3/1999 | Sooriakumar et al. | 381/174 |
| 5,926,721 | A | * | 7/1999 | Hong et al. | 438/413 |
| 6,093,330 | A | * | 7/2000 | Chong et al. | 216/2 |
| 6,180,480 | B1 | * | 1/2001 | Economikos et al. | 438/386 |
| 6,307,247 | B1 | * | 10/2001 | Davies | 257/522 |

FOREIGN PATENT DOCUMENTS

| JP | 4114470 | 4/1992 |
| JP | 9082983 | 3/1997 |

OTHER PUBLICATIONS

Tabata, Osamu et al., "Anisotropic etching of silicon TMAH solutions", Sensors and Actuators, Jul. 1992. pp. 51–57.
Kovacs, Gregory T. A. et al., "Bulk Micromachining of Silicon", IEEE, Aug. 1998. Vo. 86, No. 8, pp. 1536–1551.

* cited by examiner

Primary Examiner—Caridad Everhart
Assistant Examiner—Calvin Lee
(74) Attorney, Agent, or Firm—Lisa K. Jorgenson; E. Russell Tarleton; SEED IP Law Group

(57) ABSTRACT

A method of forming buried cavities in a wafer of monocrystalline semiconductor material with at least one cavity formed in a substrate of monocrystalline semiconductor material by timed TMAH etching silicon; covering the cavity with a material inhibiting epitaxial growth; and growing a monocrystalline epitaxial layer above the substrate and the cavities. Thereby, the cavity is completely surrounded by monocrystalline material. Starting from this wafer, it is possible to form a thin membrane. The original wafer must have a plurality of elongate cavities or channels, parallel and adjacent to one another. Trenches are then excavated in the epitaxial layer as far as the channels, and the dividers between the channels are removed by timed TMAH etching.

9 Claims, 11 Drawing Sheets

METHOD FOR FORMING HORIZONTAL BURIED CHANNELS OR CAVITIES IN WAFERS OF MONOCRYSTALLINE SEMICONDUCTOR MATERIAL

TECHNICAL FIELD

The present invention relates to a method for forming horizontal buried channels or cavities in wafers of monocrystalline semiconductor material.

BACKGROUND OF THE INVENTION

In many applications it is necessary to form cavities inside a monocrystalline silicon substrate, for example to obtain suspended masses of microactuators and/or sensors of various types, such as speed, acceleration and pressure sensors, or to isolate electronic components.

Buried cavities can be formed substantially in two ways. According to a first solution, shown in FIG. 1, two monocrystalline silicon wafers 1, suitably excavated and presenting each a half-cavity, are bonded to one another, using an adhesive layer (for example silicon oxide 2), so that the two half-cavities form a buried cavity 3.

According to a second solution, shown in FIG. 2, a monocrystalline silicon wafer 1, suitably excavated and comprising final cavities 4, is bonded to a glass layer 5 (anodic bonding process).

These solutions are costly, have a high criticality and low productivity, and are not fully compatible with the usual technological steps of microelectronics processing. In addition, the buried cavities or channels can be arranged only on a single plane, represented by line 7 in FIG. 3, and it is not possible to form cavities or channels at different heights, as shown in FIG. 4.

SUMMARY OF THE INVENTION

The embodiments of the present invention provide a method for overcoming the disadvantages of the known solutions.

According to an embodiment of the present invention, there are provided a method for forming buried cavities in wafers of monocrystalline semiconductor material, and a wafer of monocrystalline semiconductor material. The method includes forming a cavity in a substrate and growing an epitaxial layer on the substrate and in the cavity. In one embodiment, the walls of the cavity are coated with material inhibiting epitaxial growth.

DETAILED DESCRIPTION OF THE INVENTION

To help understanding of the present invention, preferred embodiments are now described, purely by way of non-limiting example, with reference to the attached drawings, wherein.

DETAILED DESCRIPTION OF THE INVENTION

Figure 1:
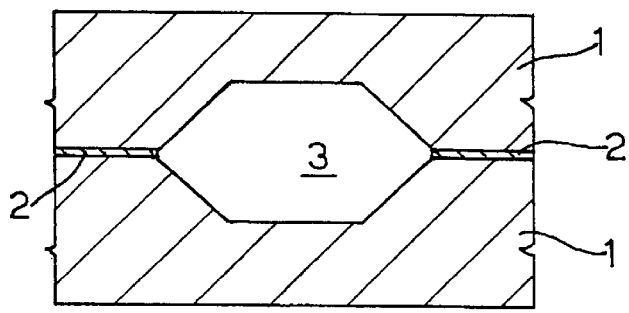
FIG. 1 shows a cross-section of a semiconductor material wafer, formed according to a known solution.
Figure 2:
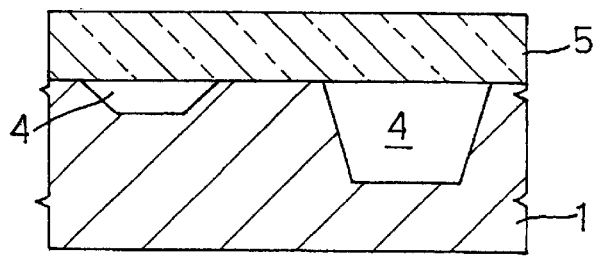
FIG. 2 shows a cross-section of another known solution.
Figure 3:
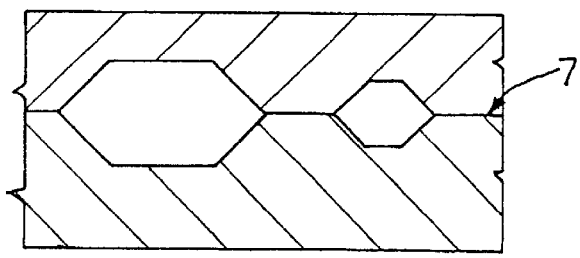
FIG. 3 shows an example of cavities formed according to the known methods.
Figure 4:
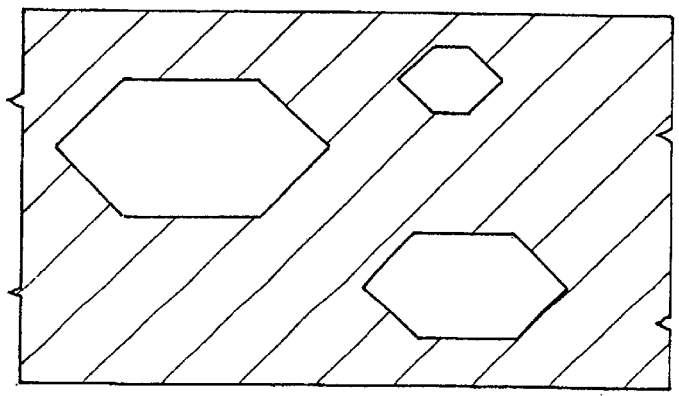
FIG. 4 shows an example of cavities arranged on different levels.
Figure 5:
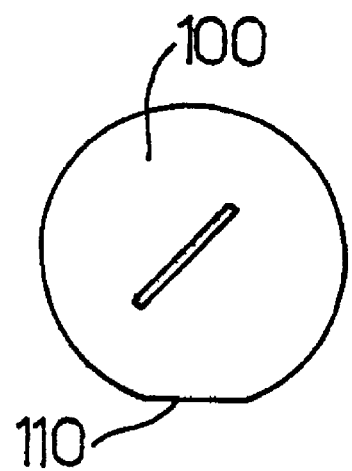
FIG. 5 shows a plan view of a semiconductor material wafer, wherein the cavities have a first orientation with respect to the wafer.

FIG. 5 shows a monocrystalline silicon wafer 10, wherein a cavity or channel is to be formed, extending at 45° with respect to the flat part of the wafer 10, determined by orientation <110>. The surface of the wafer 10 has orientation <100>.

Figure 6:
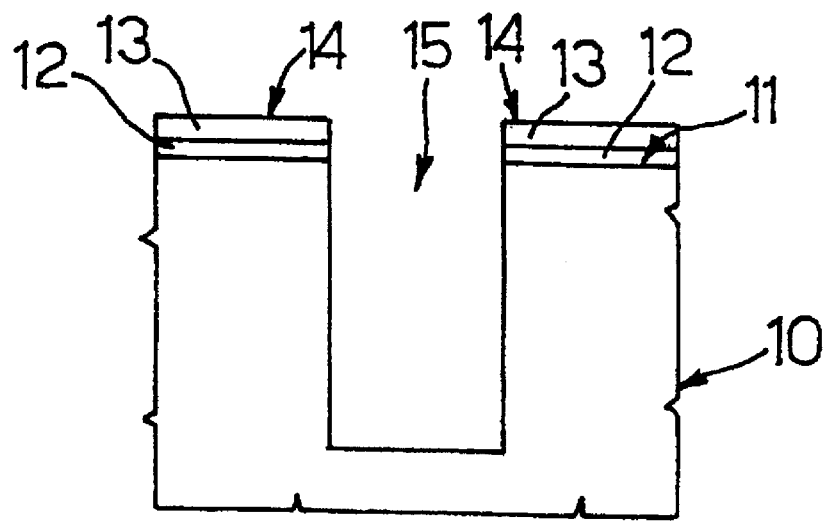
FIGS. 6–12 illustrate cross-sections of the wafer of FIG. 5, on an enlarged scale and in successive manufacture steps, according to a first embodiment.

As shown in FIG. 6, initially a first oxide layer is grown on the surface 11 of the wafer 10; the first oxide layer having a thickness comprised, for example, between 20 and 60 nm; then a nitride layer is deposited, having a thickness between 90 and 150 nm. Using a resist mask, the uncovered portions of the first nitride layer and of the first oxide layer are dry etched, and the resist mask is then removed; thereby, the portions of the first oxide layer and of the first nitride layer, remaining after the dry etching (oxide portions 12 and nitride portions 13) form a hard mask, indicated at 14.

Subsequently, using the hard mask 14, the wafer 10 is etched (first trench etching), forming first trenches 15 (FIG. 6), having a width, for example, between 1 and 3 µm (and preferably 2 µm), and a depth depending on the structures to be formed, for example of a few microns.

Figure 7:
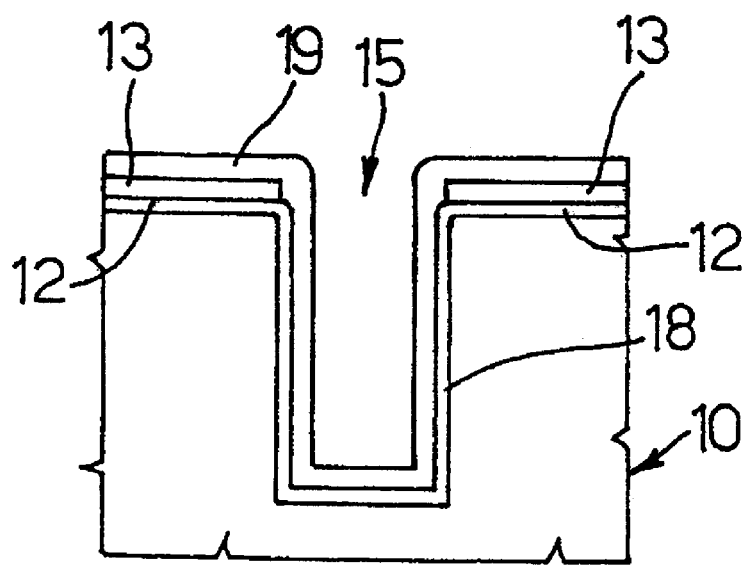

Subsequently, as shown in FIG. 7, the wafer 10 is subjected to oxidation, thus forming a second oxide layer 18 having a thickness, for example, comprised between 20 and 60 nm, covering the walls and base of the first trenches 15, and connected to the oxide portions 12, such as to form a single layer. Then a second nitride layer 19 is deposited, having a thickness, for example, comprised between 90 and 150 nm, and connected to the nitride portions 13, to form a single layer.

Figure 8:
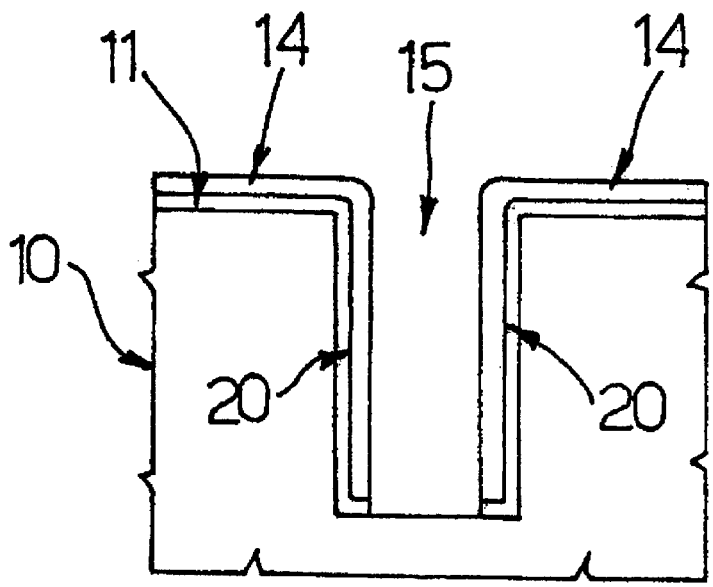

Subsequently, in FIG. 8, the nitride material is dry etched and the oxide material is dry or wet etched. This etching causes removal of the horizontal portions of the nitride layer 19 and oxide layer 18 on the bottom of the first trenches 15, and of the horizontal portions of the nitride layer 19, above surface 11 of wafer 10, thus forming a first protective coating or spacer 20 on the walls of the first trenches 15, and exposing the monocrystalline silicon on the bottom of the first trenches 15. The hard mask 14 also remains on the surface 11 of the wafer 10.

Figure 9:
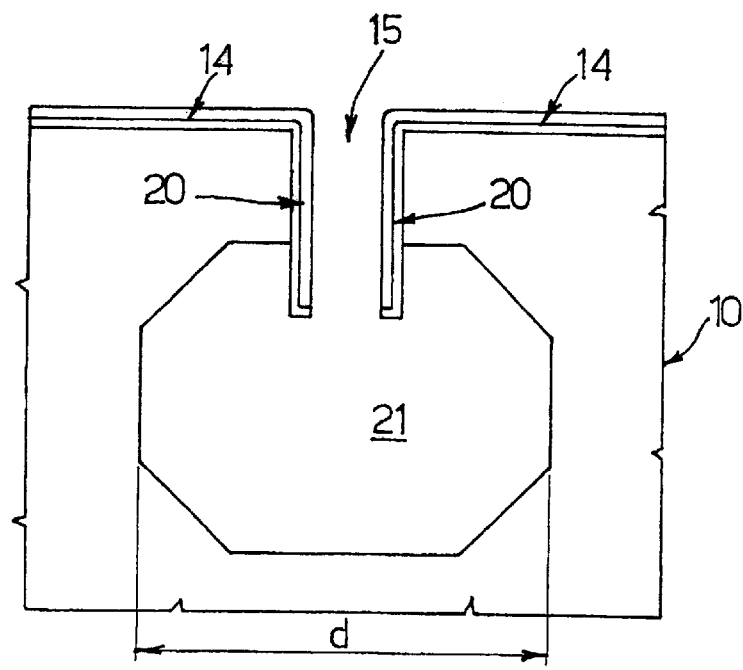

Then, in FIG. 9, the silicon material below the first trenches 15 is time etched using TMAH (tetramethylammoniumhydroxide). This etching, of anisotropic type, generates cavities 21, having a width d (at the widest point) of, for example, 10–100 μm, and therefore much larger than the first trenches 15. If the first trenches 15 have an elongate shape, in a direction perpendicular to the drawing plane, the cavities 21 form elongate channels.

Figure 10:
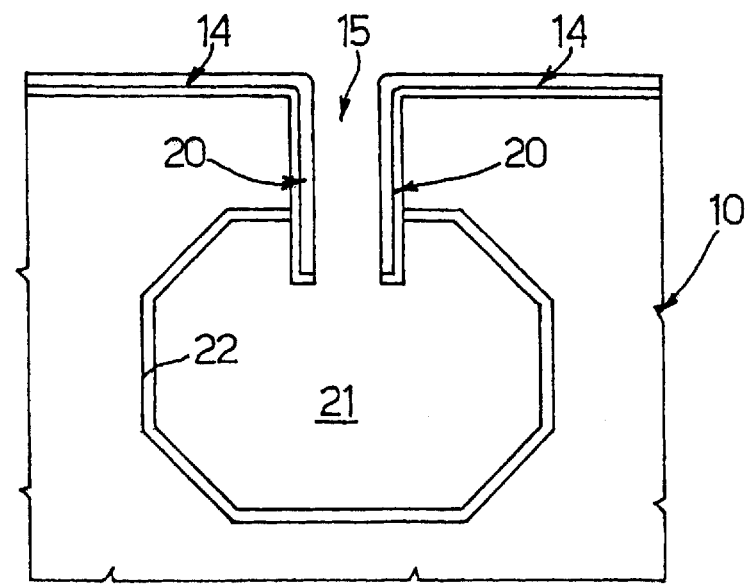

Subsequently, in FIG. 10, the walls of the cavities 21 are covered with an inhibiting layer 22, which does not allow epitaxial growth. To this end, for example, a rapid oxidation step can be carried out, to grow an oxide layer (with a greater thickness than the oxide portions 12 and 18, covering the surface 11 of the wafer 10 and the wall of the first trench 15, as described hereinafter, for example comprised between 60 and 100 nm), or a layer selected among deposited oxide, nitride, or TEOS-tetraethylorthosilicate, may be deposited.

Figure 11:
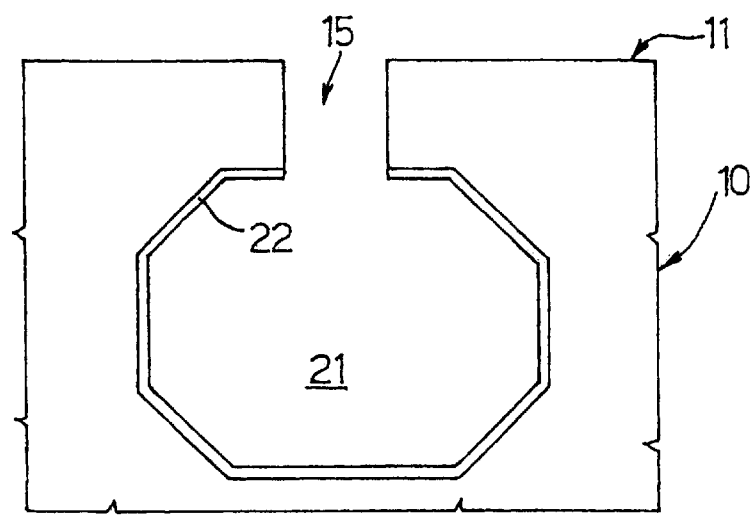

Then, in FIG. 11, the first spacers 20 are removed from the walls of the first trenches 15, and the hard mask 14 is removed from the surface 11 of the wafer 10. During removal of the oxide portions 12 and 18, part of the inhibiting layer 22 is also removed; the inhibiting layer 22 is not removed completely since it is thicker, as already stated, and remains to an extent sufficient to ensure complete covering of the walls of the cavities 21.

Figure 12:
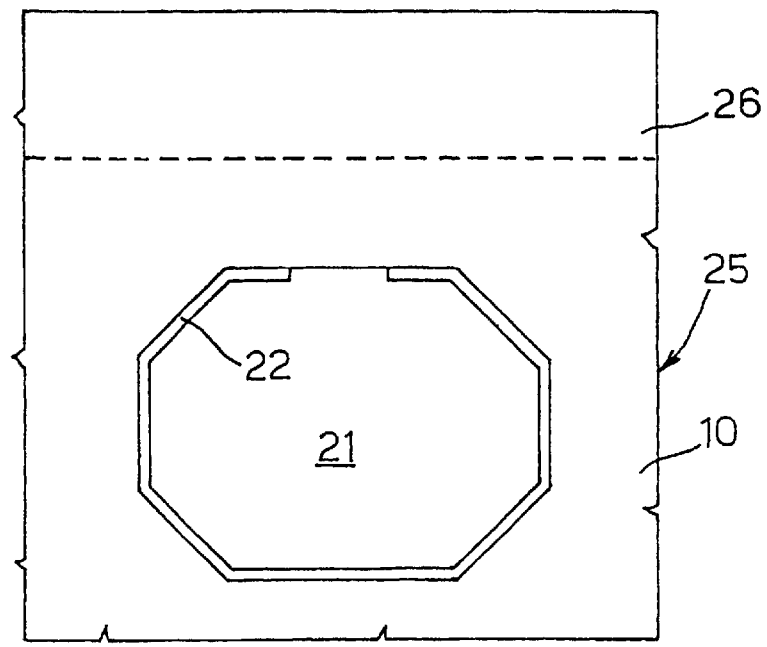

Subsequently, in FIG. 12, epitaxial growth is carried out, using as a nucleus the monocrystalline silicon of the wafer 10; consequently, monocrystalline silicon is grown horizontally, inside the first trenches 15, thus closing the latter, and vertically, from the surface 11 (which can no longer be seen in FIG. 12). On the other hand, the silicon is not grown inside the cavities 21, due to the presence of the inhibiting layer 22. Thus a monolithic wafer 25 of monocrystalline silicon is obtained, formed by the substrate 10 and an epitaxial layer 26, and accommodating closed cavities 21, delimited internally by the inhibiting layer 22.

Figure 13:
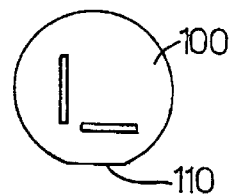
FIG. 13 shows a plan view of a semiconductor material wafer, wherein the cavities have a second orientation with respect to the wafer.
Figure 14:
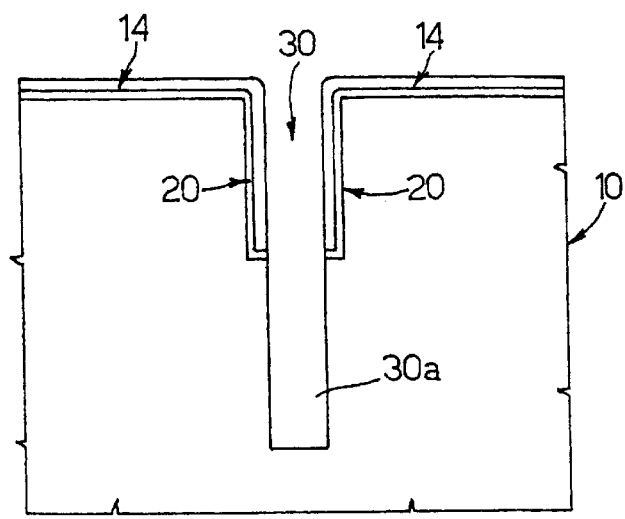
FIGS. 14 and 15 illustrate cross-sections of the wafer of FIG. 13, on an enlarged scale and in successive manufacture steps, according to a second embodiment.

If the trenches 15 (and thus the cavities 21) are oriented at 0° and 90° with respect to the flat part of the wafer 10 (as shown in plan view in FIG. 13), after forming the first spacers 20 (FIG. 8), and before TMAH etching (FIG. 9), a second trench etching is carried out, masked by the hard mask 14 and the first spacers 20 (FIG. 14). Thereby a deep trench 30 is formed, the lower portion 30a whereof extends below the first spacers 20.

Figure 15:
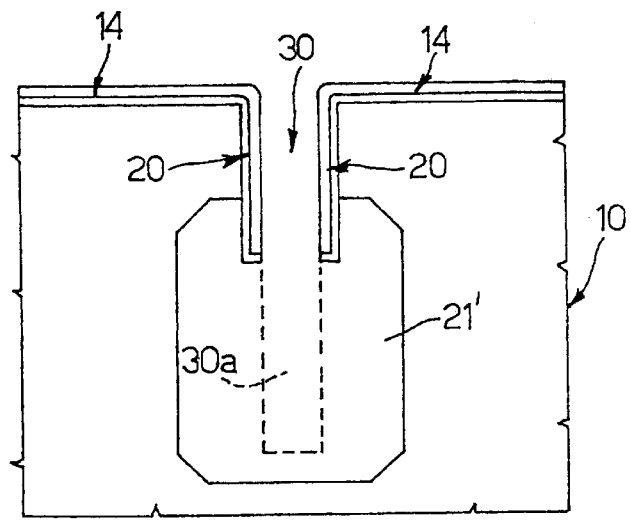

Subsequently, in FIG. 15, timed TMAH etching is carried out, forming a cavity 21' around the lower part 30a of the deep trenches 30 (shown by broken line in FIG. 15). Subsequently, the process already described with reference to FIGS. 11, 12 is carried out, forming an inhibiting layer 22, removing the hard mask 14 and the first spacers 20, and growing an epitaxial layer, to obtain the final structure of FIG. 12.

Figure 16:
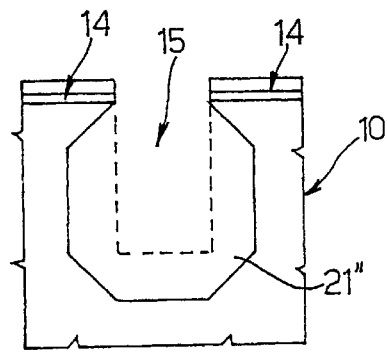
FIG. 16 illustrates a cross-section of the wafer of FIG. 13, on an enlarged scale and in a manufacture step according to a third embodiment.

According to a different embodiment, again with trenches 15 oriented at 90° with respect to the flat part 110 of the wafer 10 (as shown in FIG. 13), after forming the hard mask 14 and first trench etching, forming the first trenches 15 (FIG. 6), timed TMAH etching is carried out directly, forming a cavity 21" around the first trenches 15, FIG. 16. Similarly to the above described case, then the steps of forming an inhibiting layer 22, removing the hard mask 14 and the first spacers 20, and epitaxial growth are carried out.

The wafer 25 thus obtained may integrate electronic components and/or integrated microstructures in the epitaxial area above the cavities 21, 21', 21", in a known manner.

Figure 17:
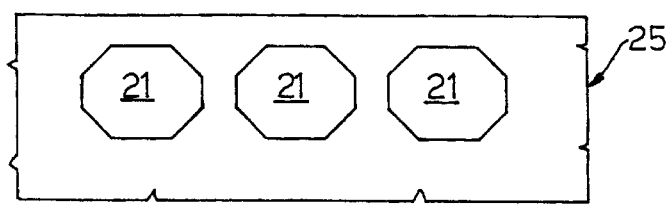
FIGS. 17–19 show cross-sections of silicon wafers, provided with cavities with different shapes and positions.
Figure 18:
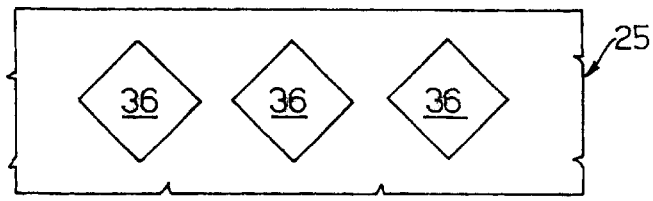
Figure 19:
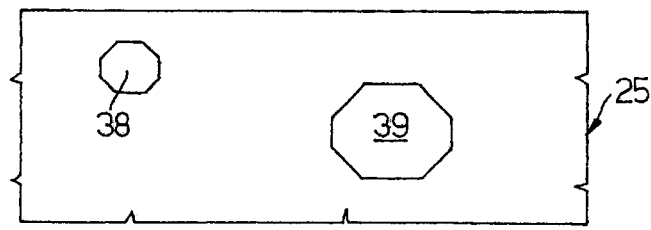

According to the orientation of cavities 21, 21', 21", the duration of TMAH etching, the number and arrangement of the cavities 21, 21', 21", it is possible to obtain various geometries, as shown in FIGS. 17–19, wherein, for simplicity, the inhibiting layer has been omitted. In detail, FIG. 17 shows a wafer 25 accommodating a plurality of cavities 21 with a substantially octagonal shape, arranged parallel to one another, in a direction at right-angle with respect to the drawing plane and at a same height. The wafer 25 in FIG. 17 is obtained in the above-described manner, and selecting a TMAH etching time that does not allow complete silicon etching.

FIG. 18 shows a wafer 25 accommodating a plurality of cavities 36 square-shaped (rotated by 45°) or rhombus-shaped, arranged similarly to the previous case parallel to one another, at a right-angle with respect to the drawing plane, at a same height. The wafer 25 in FIG. 18 is obtained furthering the TMAH etching, until obtaining the final geometry (square or rhombus, depending on the orientation of the cavities 36 with respect to the crystallographic plane of the wafer 25) caused by the TMAH etching.

FIG. 19 shows a wafer 25 accommodating a plurality of cavities 38, 39, having an octagonal shape and arranged at different heights in wafer 25. The wafer 25 of FIG. 19 is obtained by forming first trenches 15 with different depths (with different etching times), or different widths (such that the final depth of the channels 38, 39 is different); or repeating the process described with reference to FIGS. 6–12 or 14–15 or 16 several times, forming one or more cavities 39 at a first height, carrying out first epitaxial growth, forming one or more cavities 38 at a greater height, carrying out second epitaxial growth, and so on.

The above-described method may be also used to form monocrystalline silicon membranes with a reduced thickness (for example between 1 and 3 μm, if the membrane is used as a sensor, and approximately 10 μm, if electronic components are to be integrated), above an air gap of desired shape, as described hereinafter with reference to FIGS. 20–29.

Figure 20:
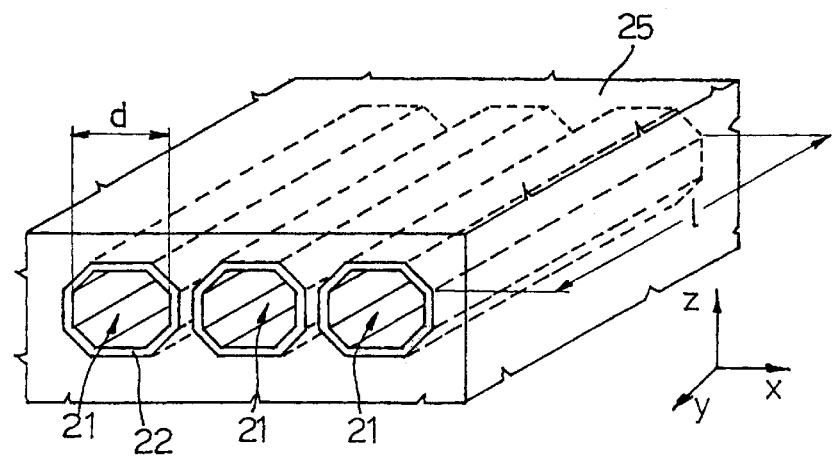
FIGS. 20 and 21 show perspective cross-sections of a wafer in two successive steps, for forming thin membranes.

To this end, beginning for example from wafer 25 of the type shown in FIG. 17, illustrated in perspective in FIG. 20, comprising a plurality of cavities or channels 21 having a length l (in direction y), much greater than their maximum width d (in direction x). In particular, the channels 21 have a length l linked to the desired length of the membrane, and are of such a number to extend along the entire width (in the direction x) of the membrane. In addition, the upper side of the channels 21 is arranged at a depth, from the surface of the wafer 25, equivalent to the desired thickness for the membrane.

Figure 21:
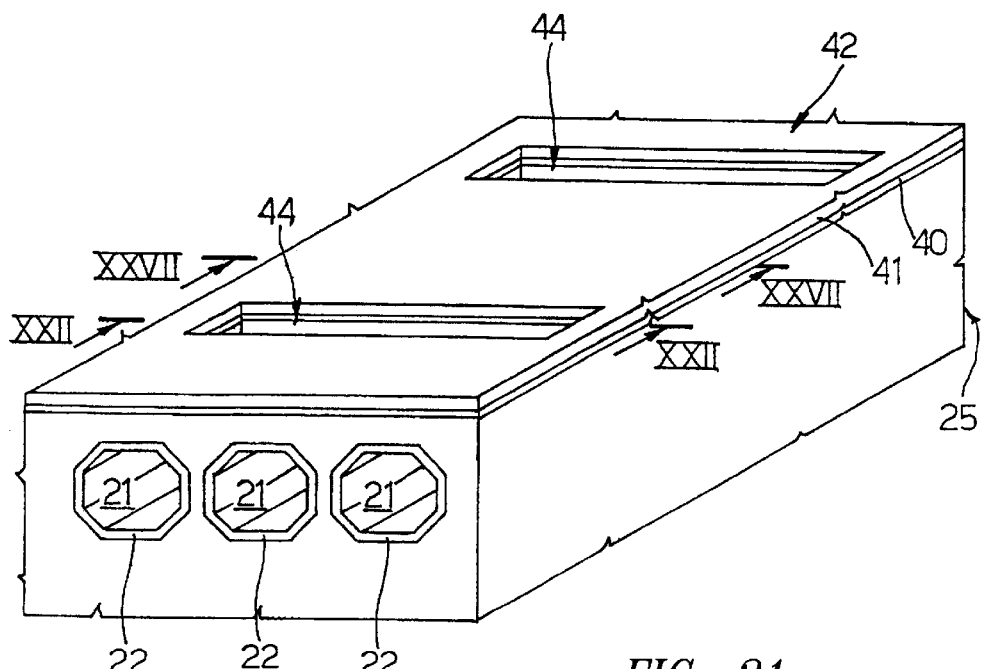
Figure 22:
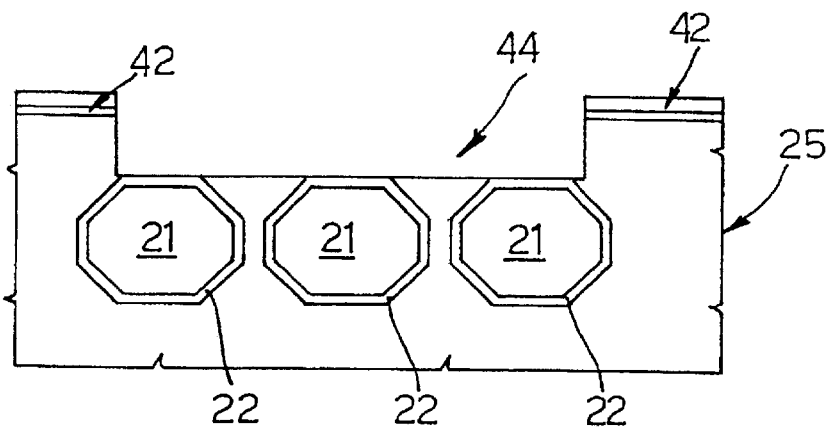
FIGS. 22–26 show cross-sections of the wafer of FIG. 21, taken along lane XXII—XXII of FIG. 21, in successive steps.

As shown in FIGS. 21 and 22, trench etching of silicon above the cavities 21 is then carried out, to form at least two connection trenches, extending parallel to one another, in a direction perpendicular to the length of the cavities 21 (parallel to the x axis in the example shown). For this purpose, in a known manner, a third oxide layer 40 is initially deposited or grown and a third nitride layer 41 is then deposited; the oxide layer 40 and the nitride layer 41 are photolithographically defined, to form a second hard mask 42 completely covering the wafer 25, except the parts where the connection trenches are to be formed; the exposed silicon is then etched, thus forming connection trenches 44, extending as far as the inhibiting layer 22 of cavities 21.

Figure 23:
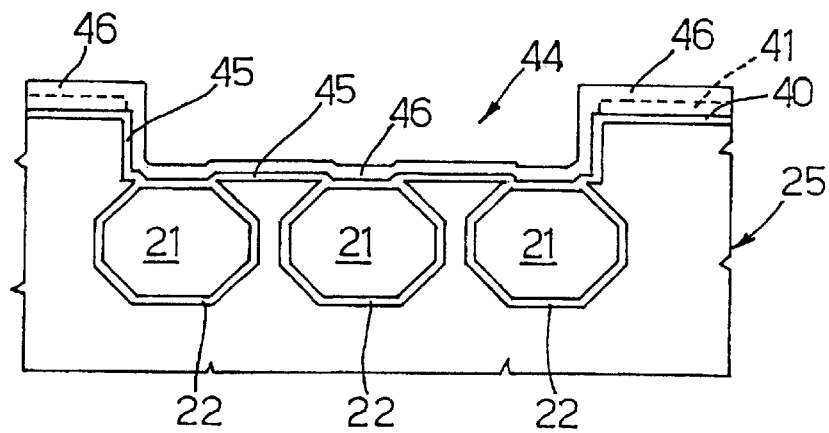

Subsequently, in FIG. 23, the surface of the connection trenches 44 is oxidized, forming a fourth oxide layer 45 (which, above the cavities 21, is integral with the inhibiting layer 22), and a fourth nitride layer 46 is deposited.

Figure 24:
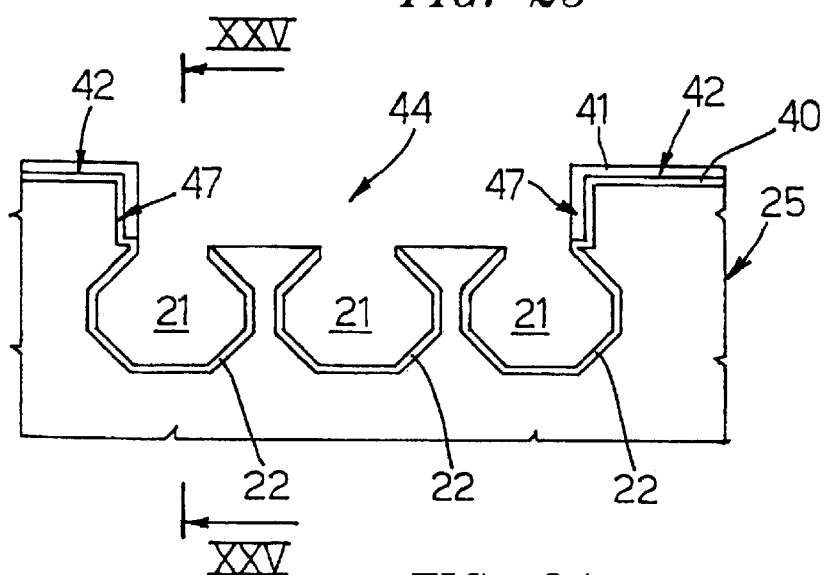
Figure 25:
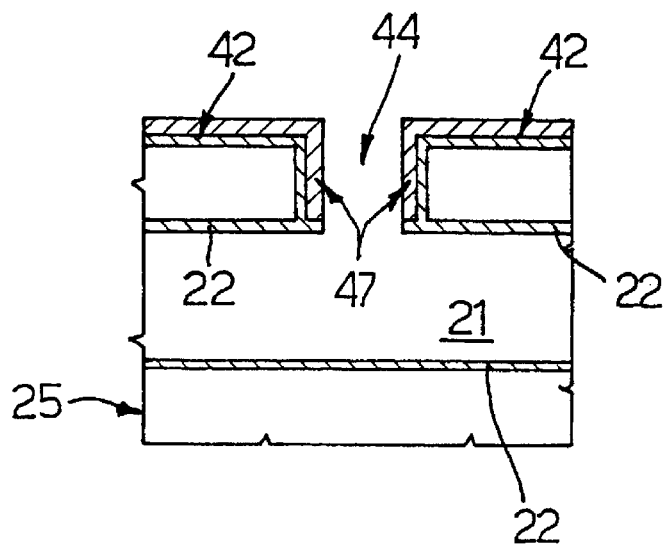

Then, in FIG. 24, the nitride and then the oxide material of layers 45, 46 is dry etched, thus removing the latter from the horizontal portions above the second hard mask 42 and from the bottom of the connection trenches 44; thereby, spacers 47 are formed above the cavities 21 and on the walls of the trenches 22. In this step, part of the inhibiting layer 22 (if of oxide), present in the upper part of the cavities 21 is also removed, as also shown in FIG. 25, showing a cross-section of a connection trench 44 taken along a cross-section plane perpendicular to FIG. 24.

Figure 26:
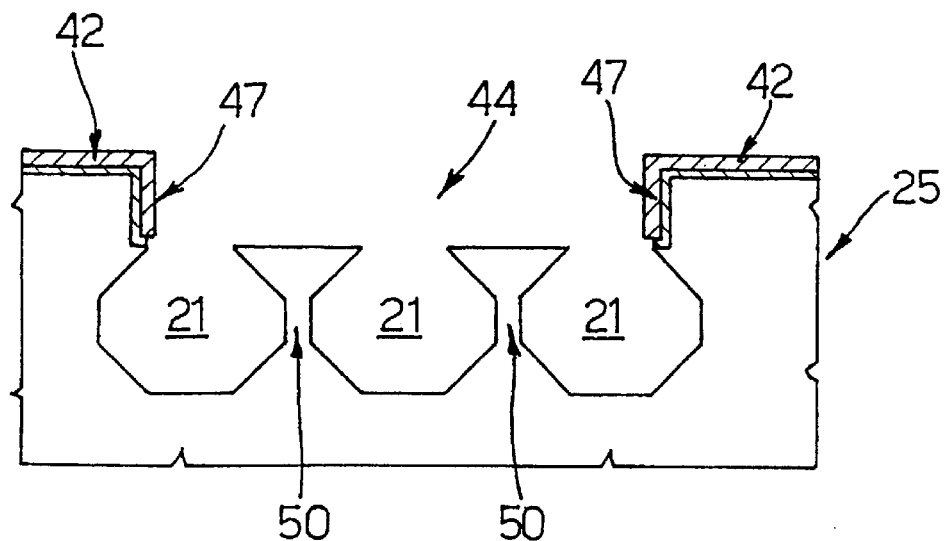
Figure 27:
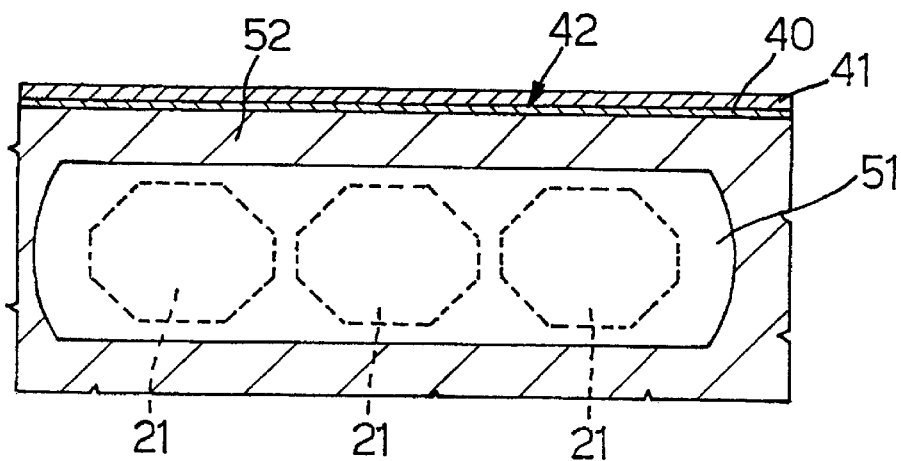
FIGS. 27–28 show cross-sections of the wafer of FIG. 21, taken along a lane parallel to plane XXII—XXII, in subsequent steps with respect to FIGS. 22–26.

Subsequently, in FIG. 26, the inhibiting layer 22 covering the walls of the cavities 21 is wet etched. The inhibiting layer 22 is thus completely removed. Subsequently, in FIG. 27, the silicon material surrounding the cavities 21 is time etched, to completely remove the diaphragms (indicated at 50 in FIG. 26) separating the cavities 21 from each other. Thereby an air gap 51 is formed, extending continuously below a monocrystalline silicon portion forming a membrane 52, as can be seen in cross-section in FIG. 27, taken along a plane parallel to FIG. 26 and not intersecting a connection trench 44. In this step, planarization of the upper and lower walls of the gap 51 is also obtained, as can be seen in FIG. 27, wherein the original cavities 21 are shown in broken lines, to help understanding.

Figure 28:
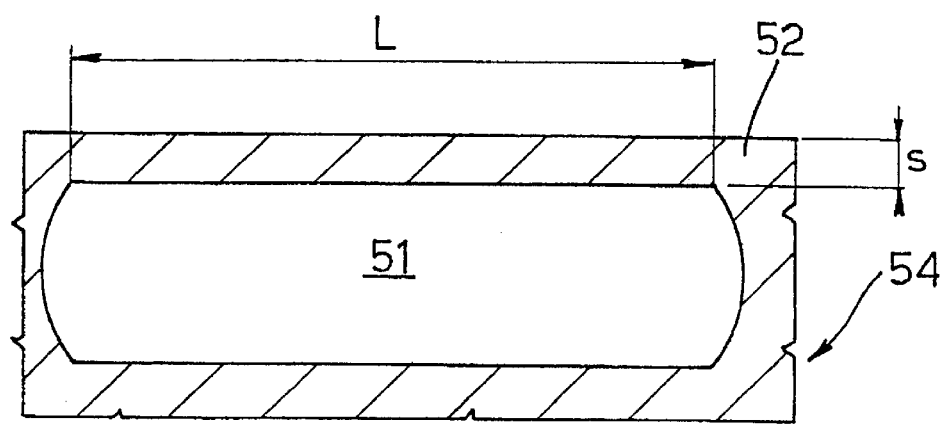

After the second hard mask 42 has been removed, a wafer 54 is thus obtained, as shown in FIG. 28, wherein the membrane 52 has a thickness to length ratio s/L <<1, for example, comprised between 0.1 and 0.01.

The advantages of the described method are apparent from the preceding description. In particular, it is emphasized that the method allows forming completely buried cavities and channels, using steps common in microelectronics, and thus reliably and repeatably. It also allows obtaining different geometries, depending on requirements, with an extensive variety of shapes. Additionally, membranes may be formed having the desired shapes and dimensions, depending on the necessary components (electronic or micro-electric-mechanical).

Finally, it is apparent that many modifications and variants can be made to the method described and illustrated here, all of which come within the scope of the invention, as defined in the attached claims, and the equivalents thereof.

What is claimed is:

1. A method for forming a membrane of monocrystalline semiconductor material, arranged above an air gap, comprising:

forming a wafer of monocrystalline semiconductor material, comprising forming a plurality of cavities in the material and growing a monocrystalline epitaxial layer on the material to encase the plurality of cavities to thereby form a plurality of buried channels adjacent and separated from each other by dividers;

forming trenches in said epitaxial layer, said trenches extending transversely to said buried channels from a surface of said wafer, as far as said buried channels; and removing said dividers.

2. The method of claim 1 wherein said buried channels have walls covered by a layer inhibiting epitaxial growth, and wherein removing said dividers comprises:

removing said layer inhibiting epitaxial growth; and anisotropically etching said semiconductor material.

3. The method of claim 2 wherein said anisotropic etching comprises TMAH timed etching.

4. The method of claim 1, further comprising, after forming third trenches, the forming of second regions extending on the walls of said trenches.

5. A method of forming encased cavities in a substrate of monocrystalline semiconductor material, comprising:

forming a plurality of trenches in the substrate;

coating lateral walls of the plurality of trenches with material resistant to etching;

anisotropically etching the substrate through each of the plurality of trenches to form a cavity below each of the plurality of trenches; and further comprising forming third trenches in the substrate, the third trenches extending transversely to the cavities from a surface of the substrate; and removing monocrystalline semiconductor material through the third trenches to connect the plurality of cavities and form an air gap in the substrate with a membrane of monocrystalline semiconductor material arranged above the air gap;

coating the walls of the cavity with a material inhibiting epitaxial growth; and growing a monocrystalline epitaxial layer on the substrate to encase the at least one trench and cavity.

6. A method for forming buried cavities in a wafer of monocrystalline semiconductor material, comprising: forming at least one cavity in a substrate of monocrystalline semiconductor material wherein forming at least one cavity comprises forming at least one first trench in said substrate; covering lateral walls of said at least one first trench with first protective regions of a material resistant to etching of said monocrystalline semiconductor material; forming at least one second trench aligned with, and arranged below the at least one first trench; anisotropically etching said substrate below said at least one first trench; coating the cavity with TEOS to inhibit epitaxial growth; and growing a monocrystalline epitaxial layer on said substrate and said at least one cavity to thereby obtain a wafer of monocrystalline semiconductor material containing at least one buried cavity completely surrounded by said monocrystalline material.

7. The method of claim 6, wherein the anisotropic etching comprises timed etching.

8. A method for forming buried cavities in a wafer of monocrystalline semiconductor material, comprising: forming at least one cavity in a substrate of monocrystalline semiconductor material wherein forming at least one cavity comprises forming at least one first trench in said substrate; covering lateral walls of said at least one first trench with first protective regions of a material resistant to etching of said monocrystalline semiconductor material; forming at least one second trench aligned with, and arranged below the at least one first trench; anisotropically etching said substrate below said at least one first trench; coating the cavity with nitride to inhibit epitaxial growth; and growing a monocrystalline epitaxial layer on said substrate and said at least one cavity to thereby obtain a wafer of monocrystalline semiconductor material containing at least one buried cavity completely surrounded by said monocrystalline material.

9. The method of claim 8 wherein the anisotropic etching comprises timed etching.

* * * * *